(12) United States Patent
Luo et al.

(10) Patent No.: US 10,998,873 B2
(45) Date of Patent: May 4, 2021

(54) CAPACITOR UNIT, INTEGRATED CAPACITOR, AND RESONANCE UNIT

(71) Applicant: HUAWEI TECHNOLOGIES CO., LTD., Guangdong (CN)

(72) Inventors: Xun Luo, Chengdu (CN); Huizhen Qian, Chengdu (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 114 days.

(21) Appl. No.: 16/374,724

(22) Filed: Apr. 3, 2019

(65) Prior Publication Data

US 2019/0229695 A1 Jul. 25, 2019

Related U.S. Application Data

(63) Continuation of application No. PCT/CN2016/101671, filed on Oct. 10, 2016.

(51) Int. Cl.
| | |
|---|---|
| *H01G 4/38* | (2006.01) |
| *H01G 2/10* | (2006.01) |
| *H01G 4/224* | (2006.01) |
| *H03H 7/01* | (2006.01) |
| *H01L 49/02* | (2006.01) |
| *H01G 4/012* | (2006.01) |

(Continued)

(52) U.S. Cl.
CPC .............. *H03H 7/0115* (2013.01); *H01G 2/10* (2013.01); *H01G 4/012* (2013.01); *H01G 4/224* (2013.01); *H01G 4/38* (2013.01); *H01L 28/60* (2013.01); *H01L 23/5223* (2013.01); *H01L 23/642* (2013.01)

(58) Field of Classification Search
CPC ............ H01G 2/10; H01G 4/224; H01G 4/38; H03H 7/0115
USPC ................................................. 333/185, 175
See application file for complete search history.

(56) References Cited

U.S. PATENT DOCUMENTS

| | | | |
|---|---|---|---|
| 2007/0187739 A1 | 8/2007 | Liu et al. | |
| 2009/0201624 A1* | 8/2009 | Hattori | H01G 4/232 361/301.3 |

(Continued)

FOREIGN PATENT DOCUMENTS

| | | |
|---|---|---|
| CN | 101043034 A | 9/2007 |
| CN | 101908563 A | 12/2010 |

(Continued)

*Primary Examiner* — Rakesh B Patel
(74) *Attorney, Agent, or Firm* — Womble Bond Dickinson (US) LLP (57) ABSTRACT

Embodiments of this application provide a capacitor unit, an integrated capacitor, and a resonance unit. The capacitor unit includes: a conductive cavity, where an accommodation space is set longitudinally through in the conductive cavity; and a conductive core, where a first part of the conductive core and a second part of the conductive core are connected by using a via hole, the first part of the conductive core is located above or below the conductive cavity, and the second part of the conductive core is located in the accommodation space of the conductive cavity; and the conductive cavity is isolated from the conductive core by using an oxide layer or an insulation layer. The embodiments of this application can reduce impact from the outside on the capacitor unit, and therefore stability of the capacitor unit can be improved.

20 Claims, 6 Drawing Sheets

(51) Int. Cl.
*H01L 23/64* (2006.01)
*H01L 23/522* (2006.01)

(56) References Cited

U.S. PATENT DOCUMENTS

| | | |
|---|---|---|
| 2010/0127348 A1 | 5/2010 | Quinn |
| 2011/0261500 A1 | 10/2011 | Parris et al. |
| 2011/0278699 A1 | 11/2011 | Lin |
| 2014/0009863 A1 | 1/2014 | Obata |
| 2017/0371473 A1* | 12/2017 | David .................. G06F 3/0416 |

FOREIGN PATENT DOCUMENTS

| | | |
|---|---|---|
| CN | 102543427 A | 7/2012 |
| CN | 203118774 U | 8/2013 |
| CN | 103531358 A | 1/2014 |
| CN | 204117858 U | 1/2015 |
| CN | 104916433 A | 9/2015 |
| CN | 205319033 U | 6/2016 |

\* cited by examiner

CAPACITOR UNIT, INTEGRATED CAPACITOR, AND RESONANCE UNIT

CROSS-REFERENCE TO RELATED APPLICATIONS

This application is a continuation of International Application No. PCT/CN2016/101671, filed on Oct. 10, 2016, the disclosure of which is hereby incorporated by reference in its entirety.

TECHNICAL FIELD

This application relates to the field of circuit devices, and in particular, to a capacitor unit, an integrated capacitor, and a resonance unit.

BACKGROUND

A capacitor is an important element in a circuit device. A silicon-based integrated process design kit (PDK)-based capacitor includes a metal-oxide-metal (MOM) integrated capacitor and a metal-insulator-metal (MIM) integrated capacitor. An existing capacitor includes multiple metal layers, and each metal layer includes multiple metal strips. A horizontal capacitor in a horizontal structure is formed between adjacent metal strips at each layer, and a vertical capacitor in a vertical structure is formed between metal strips that are at two layers and are vertically adjacent. Metal strip structures at all layers are the same. Multiple metal strips are evenly arranged horizontally and vertically in the existing capacitor. Metal strips are mutually coupled and a parasitic effect is generated, causing poor capacitor stability.

SUMMARY

Embodiments of this application provide a capacitor unit, an integrated capacitor, and a resonance unit. The capacitor unit has a self-shielding structure, and can reduce a parasitic effect, so that the capacitor unit has relatively high stability.

According to a first aspect, a capacitor unit is provided, and the capacitor unit includes: a conductive cavity, where an accommodation space is set longitudinally through in the conductive cavity; and a conductive core, where a first part of the conductive core and a second part of the conductive core are connected by using a via hole, the first part of the conductive core is located above or below the conductive cavity, the second part of the conductive core is located in the accommodation space of the conductive cavity, and the conductive cavity is isolated from the conductive core by using an oxide layer or an insulation layer.

According to the capacitor unit in this solution, the conductive core is located in a hollow location of the conductive frame, so that a self-shielding structure can be formed in the capacitor unit in a horizontal direction, and can reduce impact from the outside on electromagnetic coupling of the capacitor unit. Therefore, stability of the capacitor unit can be improved, and further the capacitor unit may be a MIM capacitor unit or a MOM capacitor unit, has high flexibility, and has relatively high compatibility and extensibility.

In one embodiment, the conductive cavity includes multiple first electric-conductors that extend in a vertical direction, two adjacent first electric-conductors in the multiple first electric-conductors are connected by using a via hole, a sub-accommodation space is set longitudinally through in each of the multiple first electric-conductors, and the accommodation space of the conductive cavity includes multiple sub-accommodation spaces of the multiple first electric-conductors; and the second part of the conductive core includes multiple second electric-conductors that have a one-to-one correspondence with the multiple first electric-conductors, two adjacent second electric-conductors in the multiple second electric-conductors are connected by using a via hole, and each second electric-conductor is located in a sub-accommodation space of a corresponding first electric-conductor.

According to the capacitor unit in this solution, a quantity of first electric-conductors and a quantity of second electric-conductors in the capacitor unit can be flexibly set, to obtain a capacitor unit that meets a requirement. The capacitor unit has high flexibility, and has relatively good compatibility and extensibility. In addition, the capacitor unit is in a stack structure, and can meet a metal density design requirement of an advanced process.

In one embodiment, an upper surface of each first electric-conductor and an upper surface of a corresponding second electric-conductor are on a same plane.

In one embodiment, a lower surface of each first electric-conductor and a lower surface of a corresponding second electric-conductor are on a same plane.

According to the capacitor unit in this solution, the first electric-conductor and the second electric-conductor are of a same height, and an area of the first electric-conductor facing to the second electric-conductor can be increased, so that the capacitor unit has a relatively high horizontal capacitance.

In one embodiment, a horizontal cross section of each first electric-conductor is in a quadrilateral structure, and a horizontal cross section of a corresponding second electric-conductor is in a quadrilateral structure; or a horizontal cross section of each first electric-conductor is in a ring structure, and a horizontal cross section of a corresponding second electric-conductor is in a circular structure.

According to the capacitor unit in this solution, a shape of the capacitor unit may be flexibly set as required, to obtain a capacitor unit that meets a requirement.

In one embodiment, a capacitor of the capacitor unit includes a vertical capacitor and a horizontal capacitor, and the horizontal capacitor includes a capacitor formed by the conductive cavity and the second part of the conductive core in a horizontal direction; and the vertical capacitor includes a capacitor formed by the first part of the conductive core and the second part of the conductive core in a vertical direction and a capacitor formed by the first part of the conductive core and the conductive cavity in a vertical direction.

In one embodiment, a capacitor of the capacitor unit includes a vertical capacitor and a horizontal capacitor, and the horizontal capacitor includes a capacitor formed by each first electric-conductor and a corresponding second electric-conductor in a horizontal direction; and the vertical capacitor includes: a capacitor formed, in a vertical direction, by the first part of the conductive core and a first electric-conductor in the multiple first electric-conductors that is adjacent to the first part of the conductive core, a capacitor formed, in a vertical direction, by the first part of the conductive core and a second electric-conductor in the multiple second electric-conductors that is adjacent to the first part of the conductive core, a capacitor formed by two adjacent first electric-conductors in the multiple first electric-conductors in a vertical direction, and a capacitor formed by two adjacent second electric-conductors in the multiple second electric-conductors in a vertical direction.

In one embodiment, the capacitor of the capacitor unit includes the vertical capacitor and the horizontal capacitor, and a capacitance of the horizontal capacitor is greater than a capacitance of the vertical capacitor.

According to the capacitor unit in this solution, the capacitance of the horizontal capacitor is greater than the capacitance of the vertical capacitor. Therefore, a capacitance of a substrate coupling capacitor unit can be effectively reduced, and a dielectric loss is reduced, so that the capacitor unit has a high quality factor, and a small on-chip capacitor unit of high linearity and a high resolution can be implemented.

According to a second aspect, an integrated capacitor is provided, the integrated capacitor includes multiple capacitor units according to the first aspect or any embodiment of the first aspect, conductive cavities of two adjacent capacitor units in the multiple capacitor units are connected, and conductive cores of the two adjacent capacitor units are connected.

According to the integrated capacitor in this solution, integrated capacitors with different capacitances and in different shapes may be obtained by adjusting a quantity of capacitor units, and the integrated capacitor has relatively high flexibility.

According to a third aspect, a resonance unit is provided, and the resonance unit includes multiple integrated capacitors according to the second aspect or any embodiment of the second aspect and an inductor coupled to the multiple integrated capacitors.

The resonance unit in this solution includes the integrated capacitor in this embodiment of this application, and the integrated capacitor has a low resistive loss, so that the resonance unit has a high quality factor.

According to a fourth aspect, an adjustable capacitor is provided, and the adjustable capacitor includes multiple integrated capacitors according to the second aspect or any possible implementation of the second aspect.

The adjustable capacitor in this solution includes the integrated capacitor in this embodiment of this application, and the integrated capacitor has advantages of a high quality factor, high linearity, a high resolution, and the like. Therefore, control precision of the adjustable capacitor can be greatly increased, so that the adjustable capacitor is suitable for a high-precision control circuit.

BRIEF DESCRIPTION OF DRAWINGS

To describe the technical solutions in the embodiments of this application more clearly, the following briefly describes the accompanying drawings required for describing the embodiments of this application. Apparently, the accompanying drawings in the following description show only some embodiments of this application, and a person of ordinary skill in the art may still derive other drawings from these accompanying drawings without creative efforts.

DESCRIPTION OF EMBODIMENTS

The following clearly describes the technical solutions in the embodiments of this application with reference to the accompanying drawings in the embodiments of this application. Apparently, the described embodiments are some rather than all of the embodiments of this application. All other embodiments obtained by a person of ordinary skill in the art based on the embodiments of this application without creative efforts shall fall within the protection scope of this application.

Figure 1:
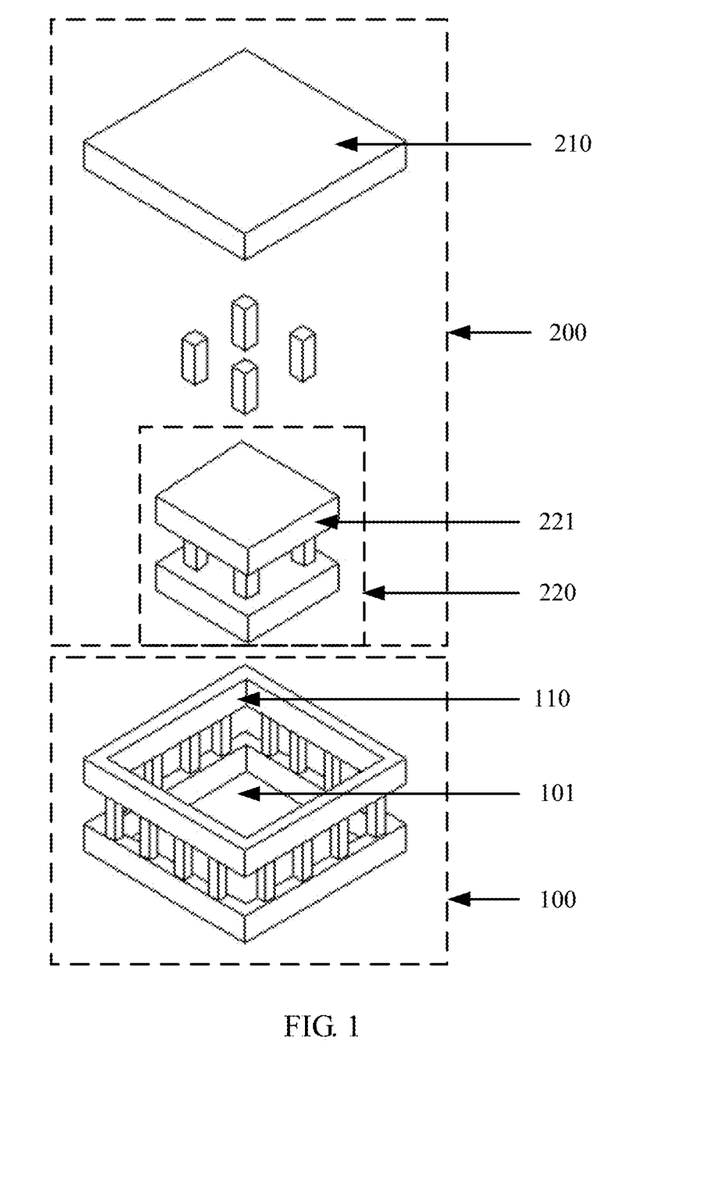
FIG. 1 is a diagram of a split of a capacitor unit according to an embodiment of this application.

FIG. 1 is a diagram of a split of a capacitor unit according to an embodiment of this application. As shown in FIG. 1, the capacitor unit includes:

a conductive cavity 100, where an accommodation space 101 is set longitudinally through in the conductive cavity 100; and a conductive core 200, where a first part 210 of the conductive core 200 and a second part 220 of the conductive core 200 are connected by using a via hole, the first part 210 of the conductive core 200 is located above or below the conductive cavity 100 (for ease of understanding, the following provides description by using an example in which the first part 210 is located above the conductive cavity 100). The second part 220 of the conductive core 200 is located in the accommodation space 101 of the conductive cavity 100.

The conductive cavity 100 is isolated from the conductive core 200 by using an oxide layer, or the conductive cavity 100 is isolated from the conductive core 200 by using an insulation layer.

Figure 2:
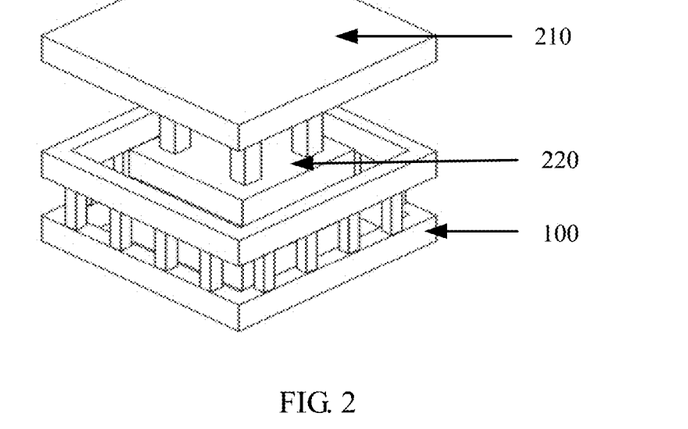
FIG. 2 is a schematic diagram of a stereoscopic structure of a capacitor unit according to an embodiment of this application.

In one embodiment, the second part 220 is located in the accommodation space 101 of the conductive cavity 100, that is, the conductive cavity 100 is located outside of the second part 220 of the conductive core 200 and can provide a shielding function. FIG. 2 is a schematic diagram of a stereoscopic structure of the capacitor unit according to this embodiment of this application. As shown in FIG. 2, the second part 220 of the conductive core 200 is located in the accommodation space (a hollow location) of the conductive cavity 100. Horizontal capacitance may be generated in a part that is between the second part 220 of the conductive core 200 and the conductive cavity 100 and that directly faces the second part 220 of the conductive core 200 and the conductive cavity 100 (a part that is between an outer wall of the second part 220 of the conductive core 200 and an inner wall of the conductive cavity 100 and that directly faces the outer wall of the second part 220 of the conductive core 200 and the inner wall of the conductive cavity 100). The conductive cavity 100 may serve as an isolation cover that isolates a horizontal capacitor formed by the second part 220 of the conductive core 200 and the conductive cavity 100 from the outside.

Therefore, according to the capacitor unit in this embodiment of this application, the conductive cavity 100 and the second part 220 of the conductive core 200 form a self-shielding structure in a horizontal direction, so as to reduce impact from the outside on electromagnetic coupling of the horizontal capacitor formed by the conductive cavity 100 and the second part 220 of the conductive core 200, and improve stability of the horizontal capacitor formed by the conductive cavity 100 and the second part 220 of the conductive core 200, so that the capacitor unit in this embodiment of this application has relatively high stability.

Figure 3:
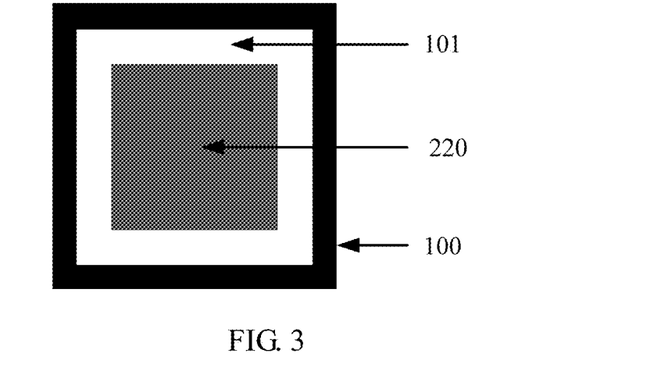
FIG. 3 is a cross-sectional schematic view of a capacitor unit according to an embodiment of this application.

FIG. 3 is a cross-sectional view of the capacitor unit according to this embodiment of this application. The second part 220 of the conductive core 200 is located in the accommodation space 101 of the conductive cavity 100, so that the capacitor unit is in a self-shielding structure, impact from the outside on the capacitor unit in this embodiment of this application can be reduced, and stability of the capacitor unit can be improved.

Further, compared with an existing capacitor structure, the capacitor unit in this embodiment of this application can centralize widgets (multiple metal strips are replaced with the conductive cavity 100 and the conductive core 200), to facilitate using of the capacitor unit.

It should be noted that structures of all widgets such as the conductive core 200 and the conductive cavity 100 in the capacitor unit in this embodiment of this application are diversified. A structure in which a part of a conductive object is inserted into another conductive object so that both a horizontal capacitor and a vertical capacitor are formed by the two conductive objects shall fall within the protection scope of the present invention.

It should be further noted that the accommodation space 101 of the conductive cavity 100 may be located at a central location of the conductive cavity 100, or may be located at a non-central location of the conductive cavity 100. This is not limited in this embodiment of this application.

It should be further noted that the second part 220 of the conductive core 200 may be located at the center of the accommodation space 101 of the conductive cavity 100, or a location of the second part 220 of the conductive core 200 in the accommodation space 101 of the conductive cavity 100 may be adjusted according to an actual requirement.

Figure 4:
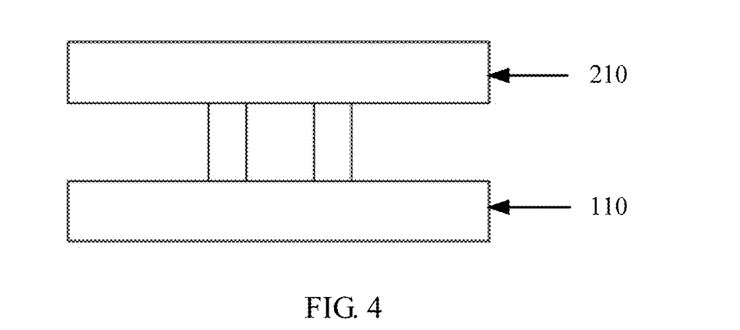
FIG. 4 is a front view of an example of a capacitor unit according to an embodiment of this application.

FIG. 4 is a front view of an example of the capacitor unit according to this embodiment of this application. As shown in FIG. 4, in an example of this application, the conductive cavity may include one first electric-conductor 110 (that is, the conductive cavity includes one layer of electric-conductor), and the second part 220 of the conductive core 200 includes one second electric-conductor 221. For brevity, the first part 210 of the conductive core 200 in this embodiment of this application may be referred to as a third electric-conductor (that is, the conductive core includes two layers of electric-conductors: the second electric-conductor 221 and the third electric-conductor, the second electric-conductor 221 and the third electric-conductor are connected by using a via hole, and the third electric-conductor may be located above the second electric-conductor 221). The second electric-conductor 221 is located in the first electric-conductor 110, and therefore the second electric-conductor 221 cannot be observed in FIG. 4. The second electric-conductor 221 and the third electric-conductor are connected by using a via hole.

Figure 5:
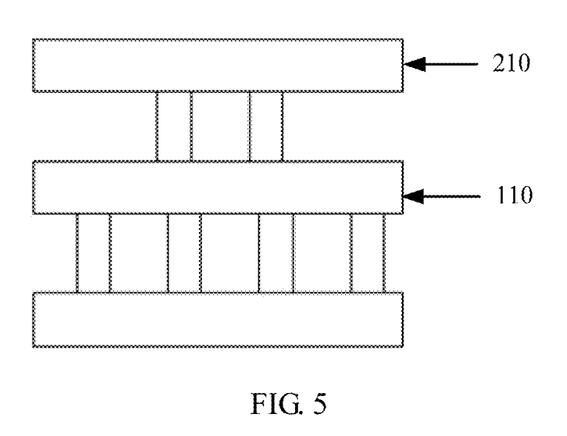
FIG. 5 is a front view of another example of a capacitor unit according to an embodiment of this application.

FIG. 5 is a front view of another example of the capacitor unit according to this embodiment of this application. As shown in FIG. 5, in another example of this application, the conductive cavity 100 may include multiple layers of electric-conductors, and the conductive core includes multiple layers of electric-conductors. The conductive cavity 100 may include multiple first electric-conductors 110 that extend in a vertical direction, and two adjacent first electric-conductors 110 in the multiple first electric-conductors 110 are connected by using a via hole. A sub-accommodation space is set longitudinally through in each of the multiple first electric-conductors 110, and the accommodation space 101 of the conductive cavity 100 includes multiple sub-accommodation spaces of the multiple first electric-conductors 110. The second part 220 of the conductive core 200 includes multiple second electric-conductors 221 that have a one-to-one correspondence with the multiple first electric-conductors 110, two adjacent second electric-conductors 221 in the multiple second electric-conductors 221 are connected by using a via hole, and each second electric-conductor 221 is located in a sub-accommodation space of a corresponding first electric-conductor 110.

In one embodiment, the multiple first electric-conductors 110 that are connected by using a via hole may form the conductive cavity 100. The multiple second electric-conductors 221 that are connected by using a via hole may form the second part 220 of the conductive core 200. The multiple second electric-conductors 221 have a one-to-one correspondence with the multiple first electric-conductors 110. For brevity, one first electric-conductor 110 and a corresponding second electric-conductor 221 may be referred to as a structure group, and the capacitor unit includes multiple structure groups that extend in a vertical direction. Two adjacent layers of structure groups may be used to form a vertical capacitor in a vertical direction, and each structure group may be used to form a horizontal capacitor in a horizontal direction.

A quantity of first electric-conductors 110 and a quantity of second electric-conductors 221 may be increased in the capacitor unit in this embodiment of this application, to obtain a capacitor unit that meets a capacitance requirement. In other words, a quantity of structure groups may be set according to an actual requirement, so that a capacitance of the capacitor unit in this embodiment of this application can meet the requirement. In addition, the first electric-conductors 110 and the second electric-conductors 221 of the capacitor unit extend in a vertical direction, so that the capacitor unit is in a stack structure, and can meet a metal density design requirement of an advanced process.

In one embodiment, an upper surface of each first electric-conductor 110 and an upper surface of a corresponding second electric-conductor 221 are on a same plane; and/or a lower surface of each first electric-conductor 110 and a lower surface of a corresponding second electric-conductor 221 are on a same plane. An area of a first electric-conductor facing to a second electric-conductor can be increased in such a structure, so that the capacitor unit has a relatively high horizontal capacitance.

In one embodiment, a horizontal cross section of the first electric-conductor 110 is in a quadrilateral structure, and a horizontal cross section of the second electric-conductor 221 is in a quadrilateral structure; or a horizontal cross section of the first electric-conductor 110 is in a ring structure, and a horizontal cross section of the second electric-conductor 221 is in a circular structure.

In this embodiment of this application, a structure of the capacitor unit may be set as required with high flexibility, to facilitate miniaturization and diversity of the structure of the capacitor unit.

The foregoing describes the capacitor unit in this embodiment of this application with reference to FIG. 1 to FIG. 5. The capacitor unit has a self-shielding structure, so as to reduce impact from the outside on the capacitor unit. Further, a capacitor of the capacitor unit includes a vertical capacitor and a horizontal capacitor. In other words, a capacitance of the capacitor unit includes a capacitance of the vertical capacitor and a capacitance of the horizontal capacitor.

In one embodiment, the horizontal capacitor includes a capacitor formed by the conductive cavity 100 and the second part 220 of the conductive core 200 in a horizontal direction. The vertical capacitor includes a capacitor formed by the first part 210 of the conductive core 200 and the second part 220 of the conductive core 200 in a vertical direction and a capacitor formed by the first part 210 of the conductive core 200 and the conductive cavity 100 in a vertical direction.

For example, it is assumed that the conductive cavity includes one first electric-conductor 110, and the second part 220 of the conductive core 200 includes one second electric-conductor 221. The third electric-conductor (a lower surface) and the first electric-conductor 110 (an upper surface) may be used to form a capacitor in a vertical direction (that is, the capacitor in a vertical direction may be formed in a part that is between the first electric-conductor 110 and the third electric-conductor and that directly faces the first electric-conductor 110 and the third electric-conductor). The third electric-conductor (the lower surface) and the second electric-conductor 221 (an upper surface) may also be used to form a capacitor in a vertical direction. The first electric-conductor 110 (an inner wall) and the second electric-conductor 221 (an outer wall) may be used to form a capacitor in a horizontal direction (that is, the capacitor in a horizontal direction may be formed in a part that is between the first electric-conductor 110 and the second electric-conductor 221 and that directly faces the first electric-conductor 110 and the second electric-conductor 221).

In one embodiment, the horizontal capacitor includes a capacitor formed by each first electric-conductor 110 and a corresponding second electric-conductor 221 in a horizontal direction. The vertical capacitor includes: a capacitor formed, in a vertical direction, by the first part 210 of the conductive core 200 and a first electric-conductor 110 in the multiple first electric-conductors 110 that is adjacent to the first part 210 of the conductive core 200, a capacitor formed, in a vertical direction, by the first part 210 of the conductive core 200 and a second electric-conductor 221 in the multiple second electric-conductors 221 that is adjacent to the first part 210 of the conductive core 200, a capacitor formed by two adjacent first electric-conductors 110 in the multiple first electric-conductors 110 in a vertical direction, and a capacitor formed by two adjacent second electric-conductors 221 in the multiple second electric-conductors 221 in a vertical direction.

For example, it is assumed that the conductive cavity 100 includes multiple first electric-conductors 110, and the second part 220 of the conductive core 200 includes multiple second electric-conductors 221. The third electric-conductor (a lower surface) and an adjacent first electric-conductor 110 (an upper surface) may be used to form a capacitor in a vertical direction. The third electric-conductor (the lower surface) and an adjacent second electric-conductor 221 (an upper surface) may also be used to form a capacitor in a vertical direction. Two vertically adjacent first electric-conductors 110 may also be used to form a capacitor in a vertical direction. Two vertically adjacent second electric-conductors 221 may also be used to form a capacitor in a vertical direction. Each first electric-conductor 110 (an inner wall) and a corresponding second electric-conductor 221 (an outer wall) may be used to form a capacitor in a horizontal direction.

The vertical capacitor is directly proportional to a parasitic capacitor unit such as a substrate coupling capacitor unit, that is, a larger capacitance of the vertical capacitor leads to a larger capacitance of the parasitic capacitor unit, causing a large dielectric loss and a low quality factor of the capacitor unit. The following describes in details a case in which by means of structure design in the capacitor unit in this embodiment of this application, a capacitance of the vertical capacitor of the capacitor unit may be relatively small, and a capacitance of the horizontal capacitor of the capacitor unit may be relatively large. In other words, the capacitance of the horizontal capacitor of the capacitor unit is greater than the capacitance of the vertical capacitor, so as to increase a quality factor of the capacitor unit.

For brevity, it may be assumed that a distance between the lower surface of the third electric-conductor (the first part 210) and the upper surface of the first electric-conductor 110 that is adjacent to the third electric-conductor is a first distance $d_1$, a distance between the lower surface of the third electric-conductor and the upper surface of the second electric-conductor 221 that is adjacent to the third electric-conductor is a second distance $d_2$, and a distance between the inner wall of the first electric-conductor 110 and the outer wall of the second electric-conductor 221 is a third distance $d_3$. (In an optional example, if the first electric-conductor 110 is in a quadrilateral structure, the first electric-conductor 110 may include a first inner wall, a second inner wall, a third inner wall, and a fourth inner wall. Correspondingly, the second electric-conductor 221 may include a first outer wall corresponding to the first inner wall, a second outer wall corresponding to the second inner wall, a third outer wall corresponding to the third inner wall, and a fourth outer wall corresponding to the fourth inner wall. It may be assumed that a distance between the first inner wall and the first outer wall, a distance between the second inner wall and the second outer wall, a distance between the third inner wall and the third outer wall, and a distance between the fourth inner wall and the fourth outer wall are all $d_3$.) It is assumed that an action area of each of the third electric-conductor and the first electric-conductor 110 (an area of the third electric-conductor facing to the first electric-conductor 110) is $S_1$, an action area of each of the third electric-conductor and the second electric-conductor 221 is $S_2$, and an action area of each of the first electric-conductor 110 and the second electric-conductor 221 is $S_3$. (In an optional example, similar to $d_3$, it may be assumed that an action area of each of the first inner wall and the first outer wall, an action area of each of the second inner wall and the second outer wall, an action area of each of the third inner wall and the third outer wall, and an action area of each of the fourth inner wall and the fourth outer wall are all $S_3/4$.)

When the conductive cavity includes one first electric-conductor 110, and the second part 220 of the conductive core 200 includes one second electric-conductor 221, capacitance generated between the third electric-conductor and the first electric-conductor 110 in a vertical direction may be estimated according to a formula (1), $d_1$, and $S_1$, capacitance generated between the third electric-conductor and the second electric-conductor 221 in a vertical direction may be estimated according to the formula (1), $d_2$, and $S_2$, and capacitance generated between the first electric-conductor 110 and the second electric-conductor 221 in a horizontal direction may be estimated according to formula (1), $d_3$, and $S_3$.

$$C = \frac{\varepsilon \cdot S}{4\pi k d} \quad (1)$$

In the formula (1), C is a capacitance of a capacitor unit, $\varepsilon$ is a constant, k is an electrostatic constant, S is an action area of each of two conductors that are used to form a capacitor, and d is a distance between the two conductors that are used to form the capacitor. $S_1$, $d_1$, $d_2$ and/or $S_2$ may be set to reduce a capacitance of a vertical capacitor in the capacitor unit, and/or $d_3$ and/or $S_3$ may be set to improve a capacitance of a horizontal capacitor, so that the capacitance of the horizontal capacitor in the capacitor unit in this embodiment of this application is greater than the capacitance of the vertical capacitor, thereby effectively reducing a capacitance of a substrate coupling capacitor unit, reducing a dielectric loss, and increasing a quality factor.

Similar to the foregoing description, it is assumed that the conductive cavity 100 includes multiple first electric-conductors 110, the second part 220 of the conductive core 200 includes multiple second electric-conductors 221, and the first part 210 of the conductive core 200 includes one third electric-conductor. At least one of $d_1$, $S_1$, $d_2$, $S_2$, $d_3$, $S_3$, $d_4$, $S_4$, $d_5$, $S_5$, or a quantity of structure groups in the capacitor unit may be set according to the formula (1), so that the capacitance of the horizontal capacitor in the capacitor unit is greater than the capacitance of the vertical capacitor. For $d_1$, $S_1$, $d_2$, $S_2$, $d_3$, and $S_3$, refer to the foregoing related description. $S_4$ is an action area of each of two adjacent first electric-conductors 110, $d_4$ is a distance between the two adjacent first electric-conductors 110, $d_5$ is a distance between two adjacent second electric-conductors 221, and $S_5$ is an action area of each of the two adjacent second electric-conductors 221.

It should be noted that an action area (or a directly facing area) in this embodiment of the present invention does not include areas occupied by via holes. For example, an action area of each of two adjacent first electric-conductors is used as an example. It is assumed that an area of a first electric-conductor (an upper surface) is $S_n$, there are totally 16 via holes between the two adjacent first electric-conductors, and an area of a part that is at an end of each via hole and that is connected to a first electric-conductor is $S_m$. The action area of each of a first electric-conductor A and a first electric-conductor B is $S_n - 16 S_m$.

In the prior art, a total capacitance that meets a requirement is obtained by adding metal strips. However, as metal strips increases, an increment of the capacitance of the horizontal capacitor increases in step with an increment of the capacitance of the vertical capacitor, and the increment of the capacitance of the horizontal capacitor and the increment of the capacitance of the vertical capacitor are almost the same. Therefore, in an existing capacitor structure, both the capacitance of the vertical capacitor and the capacitance of the horizontal capacitor significantly increase with increasing of the metal strips, causing a large dielectric loss and a low quality factor of an existing capacitor. In the capacitor unit in this embodiment of this application, each structure group (one first electric-conductor 110 and one second electric-conductor 221) is used to form a capacitor in a horizontal direction, so that as the first electric-conductor 110 and the second electric-conductor 221 increase, a capacitance of the horizontal capacitor of the capacitor unit increases. Two adjacent layers of structure groups can be used to form a capacitor in a vertical direction, but an action area of each of the two adjacent layers of structure groups in a vertical direction is relatively small. In this way, although as the first electric-conductor 110 and the second electric-conductor 221 increase, a capacitance of the vertical capacitor increases, amplitude of the increase is relatively small. In other words, increases in first electric-conductors 110 and second electric-conductors 221 lead to a first increment in the capacitance of the horizontal capacitor of the capacitor unit and lead to a second increment in the capacitance of the vertical capacitor of the capacitor unit. The first increment is greater than the second increment. That is, as a quantity of first electric-conductors 110 and a quantity of second electric-conductors 221 increase, a capacitance difference between the horizontal capacitor and the vertical capacitor of the capacitor unit gradually increases. Therefore, the capacitance of the horizontal capacitor is greater than the capacitance of the vertical capacitor of the capacitor unit in this embodiment of this application, and the capacitor unit in this embodiment of this application has a high quality factor.

In one embodiment, an increase in structure groups has relatively small impact on the increment in the capacitance of the vertical capacitor. Therefore, in some cases, capacitance generated between adjacent first electric-conductors in a vertical direction (that is, vertical capacitance generated between the adjacent first electric-conductors) and capacitance generated between adjacent second electric-conductors in a vertical direction may be ignored.

Figure 6:
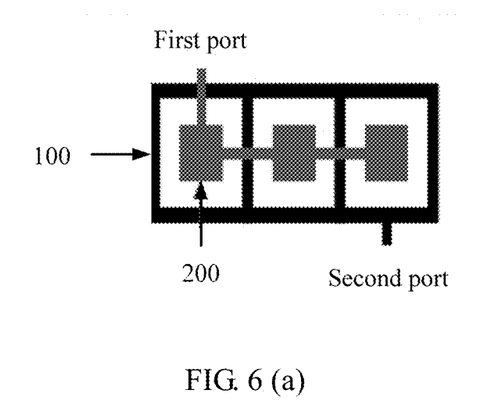
FIG. 6(a) is a schematic structural diagram of an example of an integrated capacitor according to an embodiment of this application.
FIG. 6(b) is a schematic structural diagram of another example of an integrated capacitor according to an embodiment of this application.
FIG. 6(c) is a schematic structural diagram of still another example of an integrated capacitor according to an embodiment of this application.

In this embodiment of this application, a single capacitor unit may be an integrated capacitor. Alternatively, multiple capacitor units may be connected to form an integrated capacitor. In other words, an integrated capacitor may include one or more capacitor units. FIG. 6(a) is a schematic structural diagram of an example of an integrated capacitor according to this embodiment of this application. FIG. 6(b) is a schematic structural diagram of another example of an integrated capacitor according to this embodiment of this application. FIG. 6(c) is a schematic structural diagram of still another example of an integrated capacitor according to this embodiment of this application.

As shown in FIG. 6(a), FIG. 6(b), and FIG. 6(c), in the integrated capacitor, conductive cavities 100 of two adjacent capacitor units are connected (optionally, the conductive cavities of the two adjacent capacitor units may be connected by using via holes), and conductive cores 200 of two adjacent capacitor units are connected (optionally, the conductive cores of the two adjacent capacitor units may be connected by using via holes). A first part of the integrated capacitor is connected to a conductive core of at least one of the capacitor units, and a second part of the integrated capacitor is connected to a conductive cavity of at least one of the capacitor units. The first part and the second part of the integrated capacitor is an electric signal transmitter of the integrated capacitor, for example, a current transmitter. For example, the first part is a current output end, and the second part is a current input end.

For example, it is assumed that multiple capacitor units include a first capacitor unit and a second capacitor unit that are adjacent. A conductive cavity 100 of the first capacitor unit is connected to a conductive cavity 100 of the second capacitor unit, and a conductive core 200 of the first capacitor unit is connected to a conductive core 200 of the second capacitor unit. An integrated capacitor that meets a capacitance requirement may be obtained by setting a quantity of capacitor units.

It should be noted that, that conductive cores of two adjacent capacitor units are connected by using via holes may include at least one of the following three situations:

(1) A first part 210 of the conductive core 200 of the first capacitor unit in the two adjacent capacitor units is connected to a first part 210 of the conductive core 200 of the second capacitor unit that is adjacent to the first capacitor unit.

(2) A second part 220 of the conductive core 200 of the first capacitor unit is connected to a second part 220 of the conductive core 200 of the second capacitor unit.

(3) A first part 210 of the conductive core 200 of the first capacitor unit is connected to a second part 220 of the conductive core 200 of the second capacitor unit.

In a word, specific parts that are of the conductive cores 200 of the two adjacent capacitor units and that are connected may be flexibly set as required. This is not limited in the present invention.

It should be noted that if the integrated capacitor includes multiple capacitor units, the multiple capacitor units may have a same structure or different structures. For example, the first capacitor unit in the multiple capacitor units includes two structure groups, and the second capacitor unit in the multiple capacitor units includes one structure group.

In the integrated capacitor in this embodiment of this application, a quantity of capacitor units may be flexibly increased or reduced as required, to obtain an integrated capacitor that meets a capacitance requirement. The integrated capacitor has a flexible structure. The integrated capacitor in this embodiment of this application includes at least one capacitor unit. Therefore, the integrated capacitor in this embodiment of this application has advantages of a high quality factor, high linearity, a high resolution, a flexible capacitance, a flexible shape, and the like. In addition, the integrated capacitor in this embodiment of this application can meet a requirement of a small on-chip capacitor.

Figure 7:
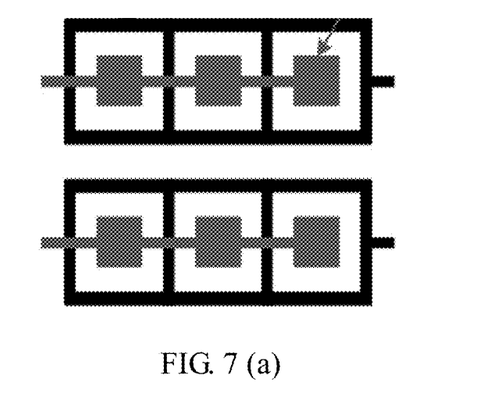
FIG. 7(a) is a schematic structural diagram of an example of a capacitor array according to an embodiment of this application.
FIG. 7(b) is a schematic structural diagram of another example of a capacitor array according to an embodiment of this application.

In one embodiment, in this embodiment of this application, two integrated capacitors may form a capacitor array. Integrated capacitors in different structures form different capacitor arrays. FIG. 7(*a*) is a schematic structural diagram of an example of a capacitor array according to this embodiment of this application. As shown in FIG. 7(*a*), in the capacitor array, each integrated capacitor may include three capacitor units, and the three capacitor units are arranged along a straight line. FIG. 7(*b*) is a schematic structural diagram of another example of a capacitor array according to this embodiment of this application. As shown in FIG. 7(*b*), in the capacitor array, each integrated capacitor may include three capacitor units, and the three capacitor units are arranged along a broken line.

In this embodiment of this application, an integrated capacitor in any structure may be set as required, and further a capacitor array in any structure may be set as required. A structure is flexible.

Figure 8:
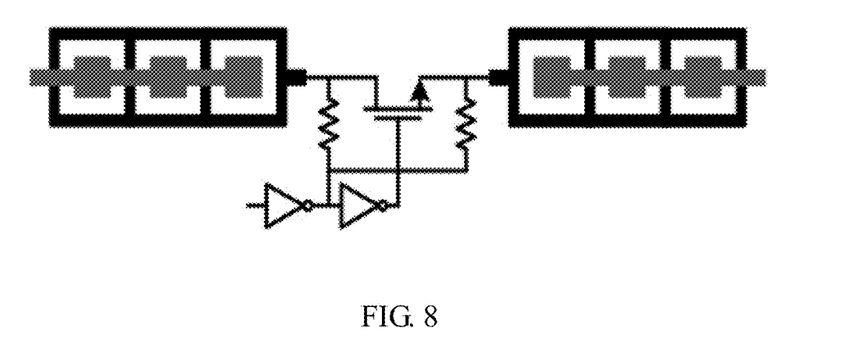
FIG. 8 is a schematic diagram of an adjustable capacitor according to an embodiment of this application.

FIG. 8 is a schematic diagram of an adjustable capacitor according to this embodiment of this application. As shown in FIG. 8, the adjustable capacitor includes multiple integrated capacitors in this embodiment of this application. In other words, multiple integrated capacitors in this embodiment of this application may form an integrated capacitor array, and the integrated capacitor array may be combined with an active switch to form the adjustable capacitor. Specifically, a MOS transistor is adjusted by cascading the adjustable capacitor, an inverter, and a resistor, to form a switch circuit. The switch circuit and the integrated capacitor array form a switch integrated capacitor array, and the adjustable capacitor can be implemented.

The adjustable capacitor includes the integrated capacitor in this embodiment of this application, and the integrated capacitor in this embodiment of this application has advantages of a high quality factor, high linearity, a high resolution, and the like. Therefore, control precision of the adjustable capacitor can be greatly increased, so that the adjustable capacitor is suitable for a high-precision control circuit.

Figure 9:
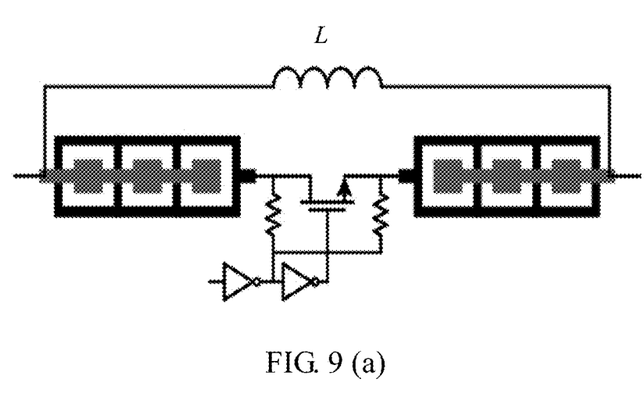
FIG. 9(a) is a schematic diagram of an example of a resonance unit according to an embodiment of this application.
FIG. 9(b) is a schematic diagram of another example of a resonance unit according to an embodiment of this application.

FIG. 9(*a*) is a schematic diagram of an example of a resonance unit according to this embodiment of this application. FIG. 9(*b*) is a schematic diagram of another example of a resonance unit according to this embodiment of this application. As shown in FIG. 9(*a*) and FIG. 9(*b*), the resonance unit includes multiple integrated capacitors in this embodiment of this application. The multiple integrated capacitors in this embodiment of this application may form an integrated capacitor array, and the integrated capacitor array may be combined with a device such as an inductor to form the resonance unit.

The resonance unit includes the integrated capacitor in this embodiment of this application, and the integrated capacitor has a low resistive loss, so that the resonance unit has a high quality factor.

It should be noted that the integrated capacitor in this embodiment of this application may be used in design of various active circuits and passive circuits, for example, a power amplifier, an oscillator, and a low noise amplifier.

Therefore, the integrated capacitor in this embodiment of this application may be applied to various active circuits and passive circuits. Because the integrated capacitor has a relatively high quality factor and relatively good stability, stability and a quality factor of an active circuit can be improved. Further, the integrated capacitor in this embodiment of this application has high flexibility (a capacitance may be adjusted by adjusting a quantity of structure groups or a quantity of capacitor units in a device), and circuit control precision can be increased.

It should be understood that in the embodiments of the present invention, "B corresponding to A" indicates that B is associated with A, and B may be determined according to A. However, it should further be understood that determining B according to A does not mean that B is determined according to A only; that is, B may also be determined according to A and/or other information. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

In the several embodiments provided in this application, the displayed or discussed mutual couplings or direct couplings or communication connections between different components may be implemented through some interfaces, or indirect couplings or communication connections between the apparatuses or units, for example, may be implemented through electrical couplings.

To make the application document brief and clear, the foregoing technical features and descriptions in an embodiment may be understood as applicable to other embodiments. The foregoing descriptions are only specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

The invention claimed is:

1. A capacitor unit, comprising:
a conductive cavity structure having an accommodation space set longitudinally through within the conductive cavity structure; and
a conductive core having a first part and a second part connected using a first via hole, wherein the first part of the conductive core is located above or below the conductive cavity structure, and the second part of the conductive core is located in the accommodation space of the conductive cavity structure, wherein a capacitor of the capacitor unit comprises a vertical capacitor and a horizontal capacitor, and wherein each of the horizontal capacitor and the vertical capacitor is formed by the conductive core and the conductive cavity structure; and
wherein the conductive cavity structure is isolated from the conductive core using an oxide layer or an insulation layer.

2. The capacitor unit according to claim 1, wherein the conductive cavity structure comprises multiple first electric-conductors that extend in a vertical direction, two adjacent first electric-conductors in the multiple first electric-conductors are connected using a second via hole, a sub-accommodation space is set longitudinally through in each of the multiple first electric-conductors, and the accommodation space of the conductive cavity structure comprises multiple sub-accommodation spaces of the multiple first electric-conductors; and
the second part of the conductive core comprises multiple second electric-conductors that have a one-to-one correspondence with the multiple first electric-conductors, two adjacent second electric-conductors in the multiple second electric-conductors are connected using a third via hole, and each second electric-conductor is located in a sub-accommodation space of a corresponding first electric-conductor.

3. The capacitor unit according to claim 2, wherein an upper surface of each first electric-conductor and an upper surface of a corresponding second electric-conductor are on a same plane.

4. The capacitor unit according to claim 2, wherein a lower surface of each first electric-conductor and a lower surface of a corresponding second electric-conductor are on a same plane.

5. The capacitor unit according to claim 2, wherein a horizontal cross section of each first electric-conductor is in a quadrilateral structure, and a horizontal cross section of a corresponding second electric-conductor is in a quadrilateral structure; or
a horizontal cross section of each first electric-conductor is in a ring structure, and a horizontal cross section of a corresponding second electric-conductor is in a circular structure.

6. The capacitor unit according to claim 2, wherein:
the horizontal capacitor comprises a capacitor formed by each first electric-conductor and a corresponding second electric-conductor in a horizontal direction; and the vertical capacitor comprises:
a first capacitor formed, in a vertical direction, by the first part of the conductive core and one of the multiple first electric-conductors that is adjacent to the first part of the conductive core;
a second capacitor formed, in a vertical direction, by the first part of the conductive core and one of the multiple second electric-conductors that is adjacent to the first part of the conductive core;
a third capacitor formed by two adjacent ones of the multiple first electric-conductors in a vertical direction; and
a fourth capacitor formed by two adjacent ones of the multiple second electric-conductors in a vertical direction.

7. The capacitor unit according to claim 1, wherein:
the horizontal capacitor comprises a first capacitor formed by the conductive cavity structure and the second part of the conductive core in a horizontal direction; and
the vertical capacitor comprises a second capacitor formed by the first part of the conductive core and the second part of the conductive core in a vertical direction and a third capacitor formed by the first part of the conductive core and the conductive cavity structure in a vertical direction.

8. The capacitor unit according to claim 7, wherein a capacitance of the horizontal capacitor is greater than a capacitance of the vertical capacitor.

9. An integrated capacitor, comprising:
a plurality of capacitor units, each capacitor unit comprising:
a conductive cavity structure having an accommodation space set longitudinally through within the conductive cavity structure; and
a conductive core having a first part and a second part connected using a first via hole, wherein the first part of the conductive core is located above or below the conductive cavity structure, and the second part of the conductive core is located in the accommodation space of the conductive cavity structure, wherein a capacitor of the capacitor unit comprises a vertical capacitor and a horizontal capacitor, and wherein each of the horizontal capacitor and the vertical capacitor is formed by the conductive core and the conductive cavity structure; and
wherein the conductive cavity structure is isolated from the conductive core using an oxide layer or an insulation layer;
wherein conductive cavity structures of two adjacent capacitor units in the capacitor units are connected, and conductive cores of the two adjacent capacitor units are connected.

10. The integrated capacitor according to claim 9, wherein the conductive cavity structure comprises multiple first electric-conductors that extend in a vertical direction, two adjacent first electric-conductors in the multiple first electric-conductors are connected using a second via hole, a sub-accommodation space is set longitudinally through in each of the multiple first electric-conductors, and the accommodation space of the conductive cavity structure comprises multiple sub-accommodation spaces of the multiple first electric-conductors; and
the second part of the conductive core comprises multiple second electric-conductors that have a one-to-one correspondence with the multiple first electric-conductors, two adjacent second electric-conductors in the multiple second electric-conductors are connected using a third via hole, and each second electric-conductor is located in a sub-accommodation space of a corresponding first electric-conductor.

11. The integrated capacitor according to claim 10, wherein an upper surface of each first electric-conductor and an upper surface of a corresponding second electric-conductor are on a same plane.

12. The integrated capacitor according to claim 10, wherein a lower surface of each first electric-conductor and a lower surface of a corresponding second electric-conductor are on a same plane.

13. The integrated capacitor according to claim 10, wherein a horizontal cross section of each first electric-conductor is in a quadrilateral structure, and a horizontal cross section of a corresponding second electric-conductor is in a quadrilateral structure; or
a horizontal cross section of each first electric-conductor is in a ring structure, and a horizontal cross section of a corresponding second electric-conductor is in a circular structure.

14. The integrated capacitor according to claim 9, wherein:
the horizontal capacitor comprises a first capacitor formed by the conductive cavity structure and the second part of the conductive core in a horizontal direction; and
the vertical capacitor comprises a second capacitor formed by the first part of the conductive core and the second part of the conductive core in a vertical direction and a third capacitor formed by the first part of the conductive core and the conductive cavity structure in a vertical direction.

15. The integrated capacitor according to claim 10, wherein:
the horizontal capacitor formed by each first electric-conductor and a corresponding second electric-conductor in a horizontal direction; and
the vertical capacitor comprises:
a first capacitor formed, in a vertical direction, by the first part of the conductive core and one of the multiple first electric-conductors that is adjacent to the first part of the conductive core;
a second capacitor formed, in a vertical direction, by the first part of the conductive core and one of the multiple second electric-conductors that is adjacent to the first part of the conductive core;
a third capacitor formed by two adjacent ones of the multiple first electric-conductors in a vertical direction; and
a fourth capacitor formed by two adjacent ones of the multiple second electric-conductors in a vertical direction.

16. The capacitor unit according to claim 14, wherein a capacitance of the horizontal capacitor is greater than a capacitance of the vertical capacitor.

17. A resonance unit, comprising:
a plurality of integrated capacitors; and
an inductor coupled to the integrated capacitors; wherein each integrated capacitor comprises a plurality of capacitor units, each capacitor unit comprising:
a conductive cavity structure having an accommodation space set longitudinally through within the conductive cavity structure; and
a conductive core having a first part and a second part connected using a first via hole, wherein the first part of the conductive core is located above or below the conductive cavity structure, and the second part of the conductive core is located in the accommodation space of the conductive cavity structure, wherein a capacitor of the capacitor unit comprises a vertical capacitor and a horizontal capacitor, and wherein each of the horizontal capacitor and the vertical capacitor is formed by the conductive core and the conductive cavity structure; and
wherein the conductive cavity structure is isolated from the conductive core using an oxide layer or an insulation layer;
wherein conductive cavity structures of two adjacent ones of the capacitor units are connected, and conductive cores of the two adjacent capacitor units are connected.

18. The resonance unit according to claim 17, wherein the conductive cavity structure comprises a plurality of first electric-conductors that extend in a vertical direction, two adjacent ones of first electric-conductors are connected using a second via hole, a sub-accommodation space is set longitudinally through in each of the first electric-conductors, and the accommodation space of the conductive cavity structure comprises a plurality of sub-accommodation spaces of the first electric-conductors; and
the second part of the conductive core comprises a plurality of second electric-conductors that have a one-to-one correspondence with the first electric-conductors, two adjacent ones of the second electric-conductors are connected using a third via hole, and each second electric-conductor is located in a sub-accommodation space of a corresponding first electric-conductor.

19. The resonance unit according to claim 17, wherein:
the horizontal capacitor comprises a first capacitor formed by the conductive cavity structure and the second part of the conductive core in a horizontal direction; and
the vertical capacitor comprises a second capacitor formed by the first part of the conductive core and the second part of the conductive core in a vertical direction and a third capacitor formed by the first part of the conductive core and the conductive cavity structure in a vertical direction.

20. The resonance unit according to claim 17, wherein:
the horizontal capacitor is formed by each first electric-conductor and a corresponding second electric-conductor in a horizontal direction; and
the vertical capacitor comprises:
a first capacitor formed, in a vertical direction, by the first part of the conductive core and one of the first electric-conductors that is adjacent to the first part of the conductive core;
a second capacitor formed, in a vertical direction, by the first part of the conductive core and one of the second electric-conductors that is adjacent to the first part of the conductive core;
a third capacitor formed by two adjacent ones of the first electric-conductors in a vertical direction; and
a fourth capacitor formed by two adjacent ones of the second electric-conductors in a vertical direction.

* * * * *